(12) United States Patent
Pasanen et al.

(10) Patent No.: US 8,581,672 B2
(45) Date of Patent: Nov. 12, 2013

(54) FREQUENCY SYNTHESIS

(75) Inventors: Pirjo Pasanen, Helsinki (FI); Vladimir Ermolov, Espoo (FI); Markku Anttoni Oksanen, Helsinki (FI); Martti Voutilainen, Espoo (FI); Eira Seppala, Helsinki (FI)

(73) Assignee: Nokia Corporation, Espoo (FI)

( * ) Notice: Subject to any disclaimer, the term of this patent is extended or adjusted under 35 U.S.C. 154(b) by 55 days.

(21) Appl. No.: 12/780,241

(22) Filed: May 14, 2010

(65) Prior Publication Data

US 2011/0280340 A1 Nov. 17, 2011

(51) Int. Cl.
*H03K 7/02* (2006.01)
*H01S 1/02* (2006.01)

(52) U.S. Cl.
USPC ........................................................ 332/115

(58) Field of Classification Search
USPC ................ 331/16; 360/55; 332/100, 149, 115
See application file for complete search history.

(56) References Cited

U.S. PATENT DOCUMENTS

| | | | | |
|---|---|---|---|---|
| 6,529,556 | B1 * | 3/2003 | Perdue et al. | 375/260 |
| 7,471,491 | B2 | 12/2008 | Sato et al. | 360/313 |
| 7,548,739 | B2 | 6/2009 | Sato | 455/258 |
| 7,616,412 | B2 | 11/2009 | Zhu et al. | 360/324.2 |
| 7,678,475 | B2 * | 3/2010 | Slavin et al. | 428/811 |
| 2003/0234696 | A1 | 12/2003 | Joe | 331/101 |
| 2009/0066428 | A1 | 3/2009 | Badets | 331/49 |
| 2009/0201614 | A1 | 8/2009 | Kudo et al. | 360/324.11 |
| 2009/0302953 | A1 | 12/2009 | Xi et al. | 331/60 |
| 2010/0296203 | A1 * | 11/2010 | Kawakami et al. | 360/324.11 |
| 2010/0321993 | A1 * | 12/2010 | Nikonov et al. | 365/171 |

FOREIGN PATENT DOCUMENTS

EP 1 526 693 A1 4/2005

OTHER PUBLICATIONS

Patrick Villard et al., A GHz Spintronic-Based RF Oscillator, IEEE Journal of Solid-State Circuits, vol. 45 No. 1, (Jan. 2010), (pp. 214-223).
M. Manfrini et al., "Agility of vortex-based nanocontact spin torque oscillators", Applied Physics Letters 95, 192507 (2009), (pp. 1-3).
"Performance of a Multiband Impulse Radio UWB Architecture" Martin Mittelbach, Rainer Moorfeld, Adolf Finger, Proceedings of Mobility 06, Oct. 25-27, 2006, Bangkok, Thailand.
Spin-torque oscillator using a perpendicular polarizer and a planar free layer, D. Houssameddine, U. Ebels, B. Delaët, B. Rodmacq, I. Firastrau, F. Ponthenier, M. Brunet, C. Thirion, J.-P. Michel, L. Prejbeanu-Buda, M.-C. Cyrille, O. Redon & B.Dieny, Nature Materials 6, 447-453 (2007).
"Spin transfer oscillators emitting microwave in zero applied magnetic field", Devolder T, Meftah A, Ito K, et al., Journal of Applied Physics vol. 101 Issue: 6 Article No. 063916 Published: Mar. 15, 2007.
"Frequency modulation of spin-transfer oscillators", M.R. Pufall, W.H.Rippard, S. Kaka, T.J. Silva, and S.E. Russek, Appl. Phys.Lett. 86, 082506 (2005).

(Continued)

*Primary Examiner* — Joseph Chang
(74) *Attorney, Agent, or Firm* — Harrington & Smith

(57) ABSTRACT

An apparatus including a spin torque oscillator configured to receive an input electric current and to produce a radio frequency output signal; and a tunable current source for providing an input electric current to the spin torque oscillator.

19 Claims, 4 Drawing Sheets

(56) References Cited

OTHER PUBLICATIONS

"Spin transfer induced coherent microwave emission with large power from nanoscale MgO tunnel junctions", D. Houssameddine, S. H. Florez, J. A. Katine, J.-P. Michel, U. Ebels, D. Mauri, O. Ozatay, B. Delaet, B. Viala, L. Folks, B. D.Terris, and M.-C. Cyrille, Appl. Phys.Lett. 93, 022505 (2008).

"Spin Torque Nano Oscillators as Potential Terahertz (THz) Communications Devices", Alma E. Wickenden, Chris Fazi, Ben Huebschman, Roger Kaul, Andrew C. Perrella, William H. Rippard, and Matthew R. Pufall, ARL-TR-4807, Apr. 2009.

"Nonlinear Auto-Oscillator Theory of Microwave Generation by Spin-Polarized Current", Andrei Slavin and Vasil Tiberkevich, IEEE Trans. Magn. 45, 1875 (2009).

"Direct-Current Induced Dynamics in Co90Fe10=Ni80Fe20 Point Contacts", W. H. Rippaid, M. R. Pufall, S. Kaka, S. E.Russek, and T. J. Silva, Phys. Rev. Lett. 92, 027201 (2004).

"Time-Domain Measurements of Nanomagnet Dynamics Driven by Spin Transfer Torques", I. N. Krivorotov,* N. C.Emley, J. C. Sankey, S. I. Kiselev, D. C. Ralph, R. A. Buhrman, Science 307, 228 (2005).

* cited by examiner

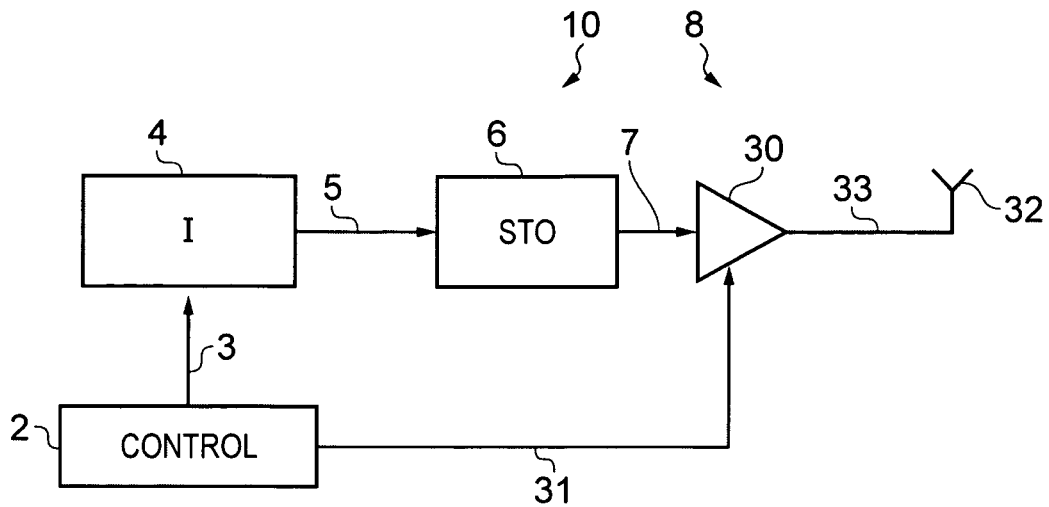
FIG. 6
| SYMBOL | AMPLITUDE | POWER ADJUST |
|---|---|---|
| A | $I_A$ | $P_A$ |
| B | $I_B$ | $P_B$ |
| C | $I_C$ | $P_C$ |
FIG. 7
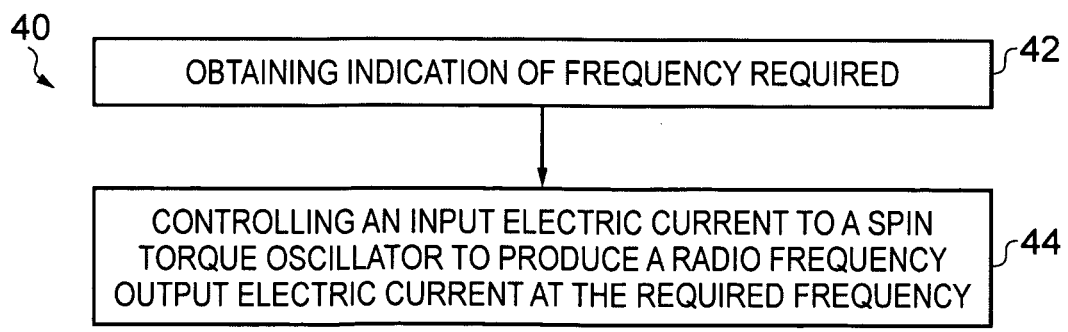
FIG. 8

FREQUENCY SYNTHESIS

TECHNOLOGICAL FIELD

Embodiments of the present invention relate to frequency synthesis. In particular, they relate to frequency synthesis at radio frequencies.

BACKGROUND

Although radio frequency synthesizers currently exist that are capable of producing electric current that oscillates at a radio frequencies, they suffer from some disadvantages.

Some are not capable of operating over broad frequency ranges. Some are not capable of quickly switching between different frequencies. Other are bulky or difficult to integrate with other technologies used in radio systems.

BRIEF SUMMARY

According to various, but not necessarily all, embodiments of the invention there is provided an apparatus comprising: a spin torque oscillator configured to receive an input electric current and to produce a radio frequency output signal; and a tunable current source for providing an input electric current to the spin torque oscillator.

According to various, but not necessarily all, embodiments of the invention there is provided a method comprising: obtaining indication of output frequency required controlling an input electric current to a spin torque oscillator to produce a radio frequency output signal at the required output frequency.

BRIEF DESCRIPTION

Figure 1:
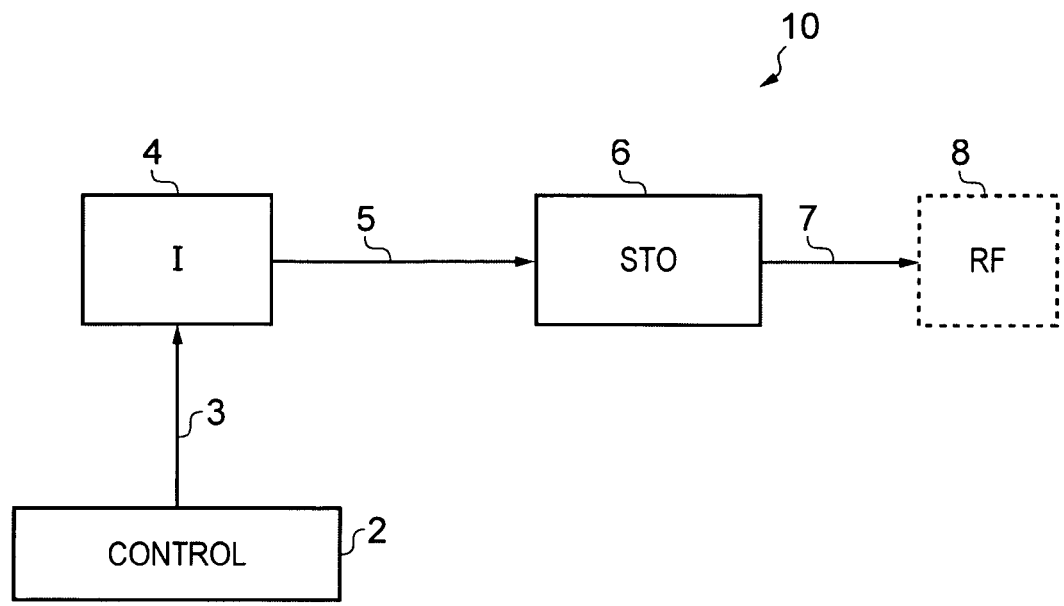
Figure 2A:
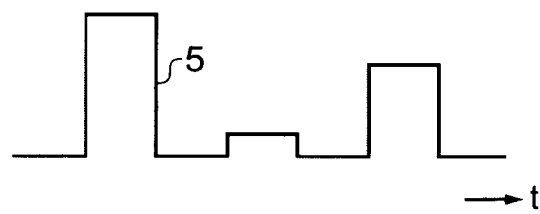
Figure 2B:
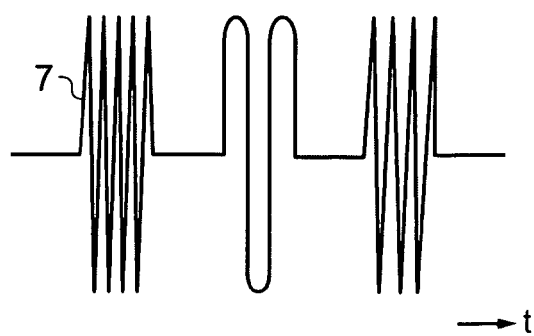
Figure 3:
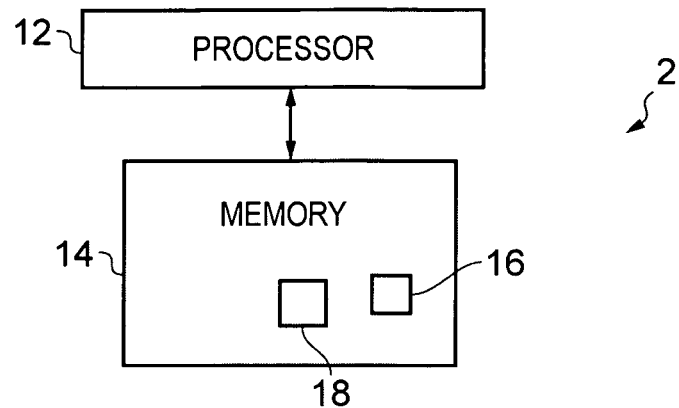
Figure 4:
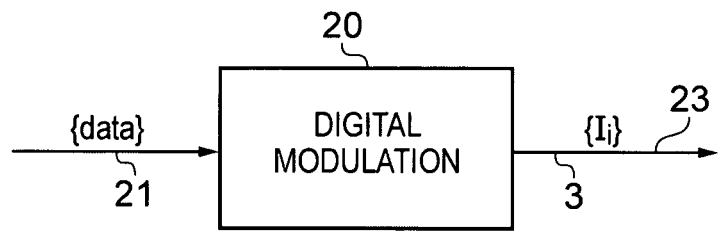
Figure 5:
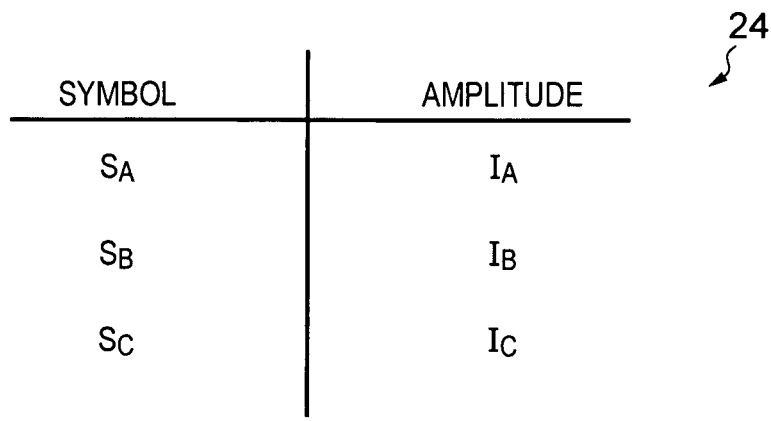

For a better understanding of various examples of embodiments of the present invention reference will now be made by way of example only to the accompanying drawings in which:

FIG. 1 schematically illustrates an example of an apparatus operating as a frequency synthesizer creating a radio frequency output signal;

FIG. 2A schematically illustrates an example of an electric current to a spin torque oscillator;

FIG. 2B schematically illustrates an example of an output signal from a spin torque oscillator;

FIG. 3 schematically illustrates an example of a controller;

FIG. 4 schematically illustrates digital modulation;

FIG. 5 schematically illustrates a data structure used for digital modulation;

FIG. 6 schematically illustrates an example of an apparatus operating as a frequency synthesizer creating a radio frequency output signal;

FIG. 7 schematically illustrates a data structure used for power compensation;

FIG. 8 schematically illustrates a method 40.

Figure 9:
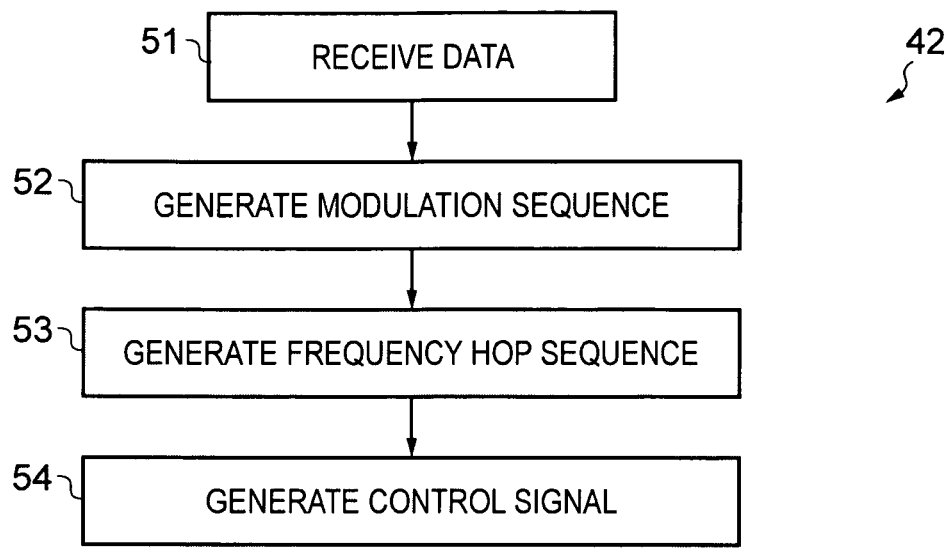
Figure 10:
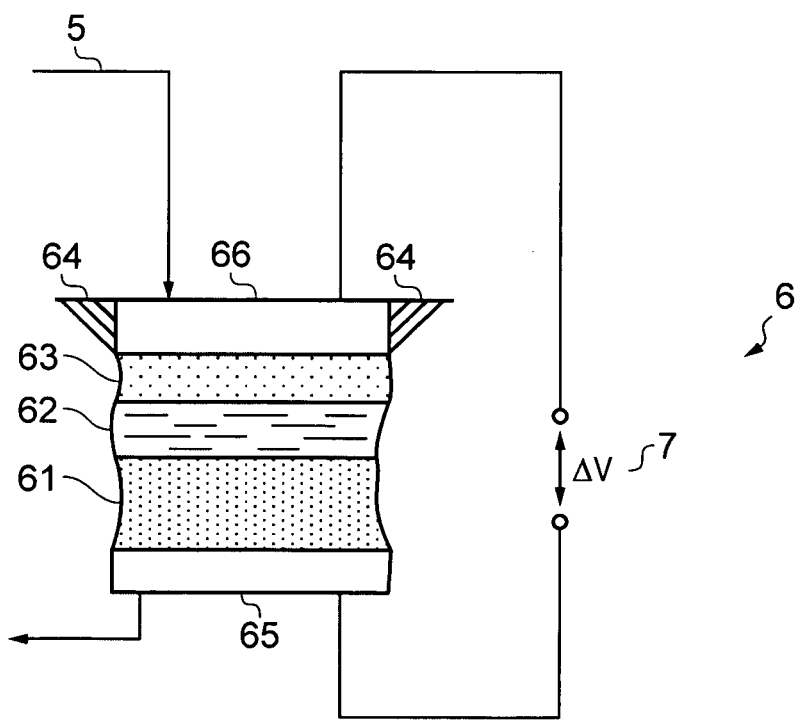

FIG. 9 schematically illustrates one example of the block in the method of FIG. 8; and FIG. 10 schematically illustrates an example of a spin torque oscillator.

DETAILED DESCRIPTION

The Figures illustrate an apparatus 10 comprising: a spin torque oscillator 6 configured to receive an input electric current 5 and to produce a radio frequency output signal 7; and a tunable current source 4 for providing an input electric current 5 to the spin torque oscillator 6.

FIG. 1 schematically illustrates an apparatus 10. The apparatus 10, in this example, is operating as a frequency synthesizer creating a radio frequency output signal 7. The apparatus 10 may additionally provide data modulation onto the output electric current 5 as described below.

The illustrated apparatus 10 comprises, in this example, a controller 2, a tunable current source 4 and a spin torque oscillator 6.

The controller 2 generates and provides a control signal 3 to the tunable current source 4. The tunable current source is configured to provide an input electric current 5 to the spin torque oscillator 6. The input electric current 5 is tunable by the control signal 3. In particular how the amplitude of the input electric current 5 provided by the current source varies in time is controlled by the control signal 3.

FIG. 2A schematically illustrates an example of how the input electric current 5 may vary in time.

The spin torque oscillator 6 receives the input electric current 5 and is configured to produce a radio frequency output electric current 7. The frequency of the radio frequency output signal 7 is dependent upon the amplitude of the input electric current 5 and an applied magnetic field (if any).

FIG. 2B schematically illustrates an example of how the output signal 7 may vary in time. This output signal 7 illustrated is produced by the spin torque oscillator 6 when it receives the input electric current 5 illustrated in FIG. 2A. It can be seen that the frequency of oscillations in the output signal 7 increases when the magnitude of the input electric current 5 increases. It can also be seen that the response of the frequency of oscillations in the output signal 7 to changes in the magnitude of the input electric current 5 is extremely fast. In FIG. 2B the magnitude of the output signal 7 is illustrated as the same amplitude, however, in actual implementations there may be some dispersion and the amplitude may vary with the frequency.

Referring back to FIG. 1 the radio frequency output signal 7 is then provided to radio frequency circuitry 8 which typically includes at least an antenna for converting the radio frequency output signal 7 to transmitted radio signals at the radio frequency.

The controller 2 is configured to control a frequency of the radio frequency output signal 7 by controlling the amplitude of the input electric current 5 provided to the spin torque oscillator 6.

The controller 2 may be implemented using instructions that enable hardware functionality, for example, by using executable computer program instructions in a general-purpose or special-purpose processor that may be stored on a computer readable storage medium (disk, memory etc) to be executed by such a processor.

One example of a controller 2 is illustrated in FIG. 3. A processor 12 is configured to read from and write to the memory 14. The processor 12 may also comprise an output interface via which data and/or commands are output by the processor 12 and an input interface via which data and/or commands are input to the processor 12.

The memory 14 stores a computer program 16 comprising computer program instructions that control the operation of the controller 2 when loaded into the processor 12. The computer program instructions 16 provide the logic and routines that enables the apparatus to perform the methods illustrated in FIGS. 4, 8 and 9, for example. The processor 12 by reading the memory 14 is able to load and execute the computer program 16.

The memory 14 may also store a mapping 18 that maps different symbols to control signals 3 that controls the current source 4 to produce particular predetermined amplitudes.

The computer program may arrive at the controller 2 via any suitable delivery mechanism. The delivery mechanism may be, for example, a computer-readable storage medium, a computer program product, a memory device, a record medium such as a CD-ROM or DVD, an article of manufacture that tangibly embodies the computer program 16. The delivery mechanism may be a signal configured to reliably transfer the computer program 16.

The apparatus 10 may propagate or transmit the computer program 16 as a computer data signal.

Although the memory 14 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used in this application, the term 'circuitry' refers to all of the following:
(a) hardware-only circuit implementations (such as implementations in only analog and/or digital circuitry) and
(b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and
(c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device."

Referring to FIG. 4, the controller 2 may provide digital modulation 20 of data 21 onto the transmitted radio waves by modulating the control signal 3 which is then provided to the current source 4. This modulated control signal 3 modulates the input electric current 5 which results in modulation of the output current 7 and consequently modulation of the transmitted radio waves.

Frequency Modulation

For example, wideband frequency modulation may be provided by varying the amplitude of the input current 5 across a large range. The range may be divided into a plurality of predetermined amplitude levels and each amplitude level may be associated with a particular symbol.

Referring to FIG. 5, each symbol $S_j$ in the data set 21 is associated with a particular amplitude $I_j$ of the input signal 3. If the controller 2 needs to enable transmission of a symbol $S_j$ it produces a control signal 3 that controls the current source to produce an input current 5 with amplitude $I_j$.

There is therefore a mapping 18 between different symbols and different predetermined control signals 3. Each different predetermined control signal 3 controls the current source 4 to produce a particular predetermined amplitude for the input current 5. Each predetermined amplitude of the input signal 5 results in the spin torque oscillator 6 producing a particular predetermined frequency of output current 7 which may be used to transmit radio waves having that frequency. Consequently, there is a mapping between the different symbols of data 21 and the frequency of the radio signals transmitted.

In this example, the control of the amplitude of the input current 5 modulates the data (by varying the frequency)

Frequency Hopping Bursts

As another example, wideband frequency modulation may be provided by controlling the amplitude of the input current 5 to select a frequency channel and using another modulation technique, such as on-off keying, to modulate the data in that channel.

For example, the amplitude of the input current 5 may be varied across a large range. The range may be divided into a plurality of predetermined amplitude levels and each amplitude level may be associated with a particular frequency channel.

The data may then be modulated onto a channel using a burst of input electric current 5 to the spin torque oscillator 6. A succession of bursts of the input electric current 5 can be provided to the spin torque oscillator 6 each having a different current amplitude.

Each burst may vary between a predetermined level and a base level to provide amplitude shift keying. For example, a zero base amplitude may be used for on-off keying.

In a radio communication system, there are usually some predetermined time slots/periods/structure that the transmitted signals must obey. For example, one period of time for one symbol, or a group of symbols.

Frequency modulation can be done either using one time interval for each frequency modulated symbol (which is inefficient, but may provide more reliable communication), or fast frequency shifts within one symbol interval, which effectively leads to multiband transmission (more efficient use of channel capacity).

In one embodiment, each burst in the succession of bursts of input electric current 5 provided to the spin torque oscillator 6 has a different current amplitude and includes a different shift key modulated data symbol. The different symbols are transmitted successively in particular frequency channels defined by the current amplitudes. The different symbols may be transmitted is separate symbol intervals or in the same symbol interval. This embodiment is useful for fast frequency hopping implementations which may be used to secure radio communications or to minimize interference.

In another embodiment, each burst in the succession of bursts of input electric current 5 provided to the spin torque oscillator 6 has a different current amplitude and represents the same data symbol. The symbol is transmitted successively in all the frequency channels defined by the current amplitudes within a single symbol interval. This embodiment spreads the symbol over a plurality of frequency channels simultaneously.

In this embodiment, it may be appropriate to have multiple spin torque oscillators operating in parallel each of which modulates the symbol onto its own predetermined sub-set of the frequency channels. Each of the multiple spin torque oscillators could be included in an arrangement as illustrated in FIG. 1. The current outputs 7 for the parallel arrangements would then be combined before feeding an antenna.

It should be appreciated that the apparatus 10 operates as a digital to analogue converter and no separate digital to analogue converter component is required.

As previously described the maximum amplitude of the output signal 7 may vary with frequency or the amplitude of the output signal 7 may be too low. FIG. 6 schematically illustrates an apparatus 10 that addresses this problem.

The apparatus 10 is similar to the apparatus 10 illustrated in FIG. 1 and similar reference numerals relate to similar features.

This apparatus 10, however, is part of a radio communication system, which in this example is a radio transmitter apparatus. The Figure additionally illustrates the radio frequency circuitry 8 as comprising a power amplifier 30 and an antenna 32.

The power amplifier 30 receives the output signal 7 and produces an amplified electric signal 33 at the same frequency. This amplified radio frequency signal 33 is used as a feed for the antenna 32.

The power amplifier 30 receives a compensation signal 31 from the controller 2. The controller 2 accesses a database 36 (FIG. 7) which associates different control signals 3 with different compensation signals 31.

If a first control signal 3 is provided by the controller 2 it results in a first frequency output signal 7 that has a first frequency and a first amplitude. A first compensation signal 31 is provided to the power amplifier so that the amplified signal 33 is at the first frequency and has a defined amplitude (power).

If a second control signal 3 is provided by the controller 2 it results in a second frequency output signal 7 that has a second frequency and a second amplitude. A second compensation signal 31 is provided to the power amplifier 30 so that the amplified signal 33 is at the second frequency and has the defined amplitude (power).

Thus the compensation signal 31 is predetermined to compensate for variations in the maximum amplitude of the output signal 7 as the frequency of that signal changes.

FIG. 8 schematically illustrates a method 40. The method 40 comprises: at block 42 obtaining an indication of the output frequency required. Then at block 44 controlling an input electric current to a spin torque oscillator 6 to produce a radio frequency output signal 7 at the required output frequency.

FIG. 9 schematically illustrates one example of the block 42.

At block 51, the controller 2 receives data. This may be internally generated or received from an external source.

At block 52, the controller 2 generates a modulation sequence that corresponds to the data.

At block 53, the controller 2 generates a frequency hop sequence.

At block 54, the controller 2 generates a control signal 3 that controls the spin torque oscillator 6 to generate a radio frequency output signal 7 where the radio frequency of the output signal 7 varies in accordance with the frequency hop sequence.

If frequency modulation is performed, the modulation sequence that corresponds to the symbols of the data also defines the frequency hop sequence. The data symbol is communication by changing frequency channel.

If amplitude shift keying modulation is performed, the modulation sequence that corresponds to the symbols of the data defines the amplitude key shifts and the frequency hop sequence defines what frequency channels are used for what symbols. In one fast-frequency hopping implementation, the symbols are transmitted successively in their own different frequency channels. In another wideband implementation, a symbol is transmitted successively in all the frequency channels within a single symbol interval.

FIG. 10 schematically illustrates an example of a spin torque oscillator 6. The spin torque oscillator defines a nano-scale electric current path through a magnetically fixed layer 61, a non-magnetic spacer layer 62 and a magnetically soft layer 63. In other examples of spin oscillators, more complex magnetic stacks can be used.

The spin torque oscillator 6 may be configured as a giant magneto resistance spin valve or a magnetic tunnel junction.

In this illustrated example, the magnetically soft layer 63 has a nano-scale external contact electrode 66 with surrounding insulator 64. The nano-scale components have a maximum width dimension of 10-100 nm. The magnetically fixed layer 61 has an external contact electrode 65.

The magnetization of the magnetically fixed layer 61 determines the direction of spin polarization in the input DC current 5 applied to electrode 65. The magnetically soft layer 63 has a magnetization that can be easily changed by the spin polarized input current 5. The spin polarized electric current 5 provided by the magnetically fixed layer 61 via the spacer layer 62 to the magnetically soft layer 63 results in precession of the magnetic moment of the magnetically soft layer 63. This results is an oscillating magneto-resistance of the spin torque oscillator device. The oscillating resistance can be used to generate and oscillating output signal 7

As the input current 5 increases, the oscillating frequency of the magnetos-resistance increases and the oscillation frequency of the output signal 7 increases.

The oscillations are typically in the GHz range.

The apparatus 10 is a suitable frequency synthesizer for ultra-wideband (UWB) communication.

The apparatus 10 may be a module configured for use in a radio transmitter apparatus. As used here 'module' refers to a unit or apparatus that excludes certain parts/components that would be added by an end manufacturer or a user.

The blocks illustrated in the FIGS. 4, 8 and 9 may represent steps in a method and/or sections of code in the computer program. The illustration of a particular order to the blocks does not necessarily imply that there is a required or preferred order for the blocks and the order and arrangement of the block may be varied. Furthermore, it may be possible for some steps to be omitted.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a spin torque oscillator configured to receive an input electric current and to produce a radio frequency output signal; and
   a tunable current source for providing the input electric current to the spin torque oscillator, wherein the tunable current source is configured to provide a succession of input electric current bursts to the spin torque oscillator, wherein each input electric current burst of the succession of input electric current bursts has a different current amplitude.

2. An apparatus as claimed in claim 1, wherein a controller is configured to control a frequency of the radio frequency output signal by controlling an amplitude of the input electric current provided to the spin torque oscillator.

3. An apparatus as claimed in claim 1, wherein a controller is configured to provide wideband frequency modulation by varying the amplitude of the input electric current.

4. An apparatus as claimed in claim 1, wherein a controller is configured to provide modulation by varying the amplitude of the input current between predetermined levels.

5. An apparatus as claimed in claim 1, wherein a controller is configured to provide multiband amplitude shift keying modulation by varying the input current between predetermined levels to provide respective multiband frequencies and by varying between a predetermined level and a base level to provide amplitude shift keying.

6. An apparatus as claimed in claim 5, wherein the amplitude shift keying is on-off keying.

7. An apparatus as claimed in claim 1, wherein a controller is configured to vary the amplitude of the input current between multiple predetermined levels within a single symbol interval.

8. An apparatus as claimed in claim 1, comprising a plurality of spin torque oscillators each configured to receive an input electric current and to produce a radio frequency output signal; and a plurality of tunable current source each configured to provide an input electric current to a respective spin torque oscillator.

9. An apparatus as claimed in claim 8, wherein each controller is configured to maintain the input current at a different one of a plurality of predetermined levels within each symbol interval.

10. An apparatus as claimed in claim 1, wherein a controller is configured to compensate the power of the radio frequency output signal.

11. A radio transmitter apparatus comprising the apparatus as claimed in claim 1.

12. A radio frequency synthesizer comprising:
    a spin torque oscillator configured to receive an input electric current and to produce a radio frequency output signal; and
    a tunable current source for providing an input electric current to the spin torque oscillator, wherein the tunable current source is configured to provide a succession of input electric current bursts to the spin torque oscillator, wherein each input electric burst of the succession of input electric current bursts has a different current amplitude.

13. A method comprising:
    obtaining an indication of output frequencies required;
    controlling an input electric current provided to a spin torque oscillator to produce radio frequency output signals at the required output frequencies; and
    providing a succession of input electric current bursts to the spin torque oscillator, wherein each input electric current burst of the succession of input electric current bursts has a different current amplitude.

14. A method as claimed in claim 13, comprising varying the amplitude of the input current only between predetermined levels.

15. A method as claimed in claim 13, comprising varying the input current between predetermined levels to provide respective multiband frequencies and varying between a predetermined level and a base level to provide amplitude shift keying.

16. A method as claimed in claim 13, comprising varying the amplitude of the input current between multiple predetermined levels within a single symbol interval.

17. A method as claimed in claim 13, comprising compensating the power of the radio frequency output signal.

18. A method comprising:
    providing a succession of input electric current bursts to a spin torque oscillator, wherein each input electric current burst of the succession of input electric current bursts has a different current amplitude.

19. A non-transitory computer readable medium storing computer program instructions that, when performed by at least one processor, cause at least the following to be performed:
    providing a succession of input electric current bursts to a spin torque oscillator, wherein each input electric current burst of the succession of input electric current bursts has a different current amplitude.

* * * * *